United States Patent
Kobayashi et al.

(10) Patent No.: US 6,427,103 B2
(45) Date of Patent: Jul. 30, 2002

(54) INFORMATION PROCESSING APPARATUS OF ON-VEHICLE TYPE

(75) Inventors: Hiroshi Kobayashi; Hideki Odachi; Hiroaki Fujita; Masashi Kawamoto, all of Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 0 days.

(21) Appl. No.: 09/770,455

(22) Filed: Jan. 29, 2001

(30) Foreign Application Priority Data

Jan. 31, 2000 (JP) ........................................ 2000-027316

(51) Int. Cl.$^7$ ................................................ G06F 7/00
(52) U.S. Cl. ........................................ 701/36; 123/41.49
(58) Field of Search .................. 701/36, 37; 381/73.1, 381/86; 123/319, 41.11, 41.12, 41.49; 454/15

(56) References Cited

U.S. PATENT DOCUMENTS 5,293,578 A * 3/1994 Nagami et al. ................ 381/71
5,669,336 A * 9/1997 Williams .................. 123/41.12
6,079,536 A * 6/2000 Hummel et al. ......... 192/58.62

* cited by examiner

*Primary Examiner*—Yonel Beaulieu
(74) *Attorney, Agent, or Firm*—Young & Thompson

(57) ABSTRACT

An information processing apparatus (S) of an on-vehicle type is provided with a fan (18) and a detecting device (4, 5, 6, 8, 17, 19) for detecting an operation status of a vehicle. The information processing apparatus is also provided with a controlling device (1), for controlling a rotation speed of the fan in accordance with the detected operation status.

18 Claims, 2 Drawing Sheets

INFORMATION PROCESSING APPARATUS OF ON-VEHICLE TYPE

BACKGROUND OF THE INVENTION

1. Field of the Invention

The present invention generally relates to an information processing apparatus of an on-vehicle type such as an audio apparatus of the on-vehicle type, and more particularly to an information processing apparatus of an on-vehicle type, which is mounted on a vehicle and which has a fan for cooling and/or removing dust.

2. Description of the Related Art

Conventionally, it is general that an audio apparatus such as a so-called car-radio, a cassette deck, a CD (Compact Disc) player or the like is mounted in a room or cabin of the vehicle, so as to serve music etc., to the users or passengers on the vehicle by the audio apparatus.

Recently, a so-called navigation apparatus is also generalized, which has a display device such as an LCD (Liquid Crystal Display) device or the like in the cabin of the vehicle and helps a movement of the vehicle by displaying a necessary map etc., on the display device.

In such an audio apparatus or a navigation apparatus, a device which generates heat during the operation thereof (e.g., a CPU, an amplifier or the like) and a device which should not be heated up to a certain high temperature during the operation thereof (e.g., an MD (Mini Disc) drive or the like) may be commonly built-in. Thus, a fan for cooling is often built-in so as to restrain the temperature increase by heat from the device generating the heat.

When the supply of the electric power with respect to the audio apparatus or the navigation apparatus is started, the rotation of the fan is started at the same time so as to perform the cooling operation while the rotation speed of the fan (which is defined as a rotation number per unit time, hereinbelow) is constant.

There is recently such a tendency that the silence within the cabin is regarded as an important factor.

However, even if the cabin is designed to attach importance onto the silence, since the audio apparatus or the navigation apparatus is mounted in the cabin of the vehicle, the silence cannot be preserved because of the blowing sound due to the rotation of the fan within the audio apparatus or the navigation apparatus, which is a problem.

On the other hand, if the rotation speed of the fan is reduced since too much importance is attached onto the silence within the cabin, the cooling function of the fan cannot be fulfilled, so that the audio apparatus or the navigation apparatus may be failed due to the heat, which is another problem.

SUMMARY OF THE INVENTION

It is therefore an object of the present invention to provide an information processing apparatus of an on-vehicle type, which can operate a fan for cooling or removing dust while preserving the silence in a cabin of the vehicle and at the same time preserving the rotation speed necessary for the fan, which is high enough to appropriately function.

The above object of the present invention can be achieved by a first information processing apparatus of an on-vehicle type provided with: a fan; a detecting device for detecting an operation status of a vehicle; and a controlling device, such as a CPU or the like, for controlling a rotation speed of the fan in accordance with the detected operation status.

According to the first information processing apparatus of the present invention, since the rotation speed of the fan is controlled in accordance with the operation status of the vehicle, it is possible to preserve the silence in the cabin of the vehicle as the unnecessary blowing sound of the fan is restrained by decreasing the rotation speed in case that the priority is given to the silence, for example. It is also possible to preserve the necessary rotation speed of the fan to fulfill the cooling function, the dust sucking function or the like, by increasing the rotation speed in case that the priority is not given to the silence (but to the prevention against a failure of the information processing apparatus, for example).

In this manner, it is possible to preserve both of the silence in the cabin and the necessary rotation speed of the fan, depending upon the operation status of the vehicle.

In one aspect of the first information processing apparatus of the present invention, the detecting device comprises a silence degree detecting device, such as a voice microphone or the like, for detecting a degree of silence within a cabin of the vehicle, and the controlling device sets the rotation speed to a low speed or stops a rotation of the fan if the detected degree of silence is higher than a threshold degree of silence, which may be set in advance or may be changed in operation, and sets the rotation speed to a high speed, which is higher than the low speed, if the detected degree of silence is not higher than the threshold degree of silence.

According to this aspect, since the fan is rotated at the low speed or the rotation of the fan is stopped in case that it is silent in the cabin, and since the fan is rotated at the high speed in case that it is not silent in the cabin, it is possible to preserve both of the silence in the cabin by restraining the blowing sound of the fan and the necessary rotation speed of the fan.

In another aspect of the first information processing apparatus of the present invention, the detecting device comprises a vehicle speed detecting device, such as a travel distance sensor or the like, for detecting a moving speed of the vehicle on the basis of a vehicle speed pulse signal outputted in response to the moving speed, and the controlling device sets the rotation speed to a low speed, which is lower than a reference rotation speed, or stops a rotation of the fan if the detected moving speed is not higher than a threshold moving speed, which may be set in advance or may be changed in operation.

According to this aspect, since the fan is rotated at the low speed or the rotation of the fan is stopped in case that the vehicle is moving slowly, it is possible to preserve the silence in the cabin more surely.

In another aspect of the first information processing apparatus of the present invention, the detecting device comprises a vehicle speed detecting device, such as a travel distance sensor or the like, for detecting a moving speed of the vehicle on the basis of a vehicle speed pulse signal outputted in response to the moving speed, and the controlling device sets the rotation speed to a high speed, which is higher than a reference rotation speed, if the detected moving speed is higher than a threshold moving speed, which may be set in advance or may be changed in operation.

According to this aspect, since the fan is rotated at the high speed in case that the vehicle is moving fast, it is possible to preserve the necessary rotation speed of the fan if it can be assumed that it is not necessary to preserve the silence in the cabin as the vehicle is moving fast.

In another aspect of the first information processing apparatus of the present invention, the detecting device comprises a vibration detecting device, such as an angular velocity sensor or the like, for detecting a vibration of the vehicle, and the controlling device sets the rotation speed to a low speed, which is lower than a reference rotation speed, or stops a rotation of the fan if the detected vibration indicates the operation status that the vehicle is not moving.

According to this aspect, since the fan is rotated at the low speed or the rotation of the fan is stopped in case that the vehicle is not moving, it is possible to preserve the silence in the cabin more surely.

In another aspect of the first information processing apparatus of the present invention, the detecting device comprises a vibration detecting device, such as an angular velocity sensor or the like, for detecting a vibration of the vehicle, and the controlling device sets the rotation speed to a high speed, which is higher than a reference rotation speed, if the detected vibration indicates the operation status that the vehicle is vibrating by a certain magnitude.

According to this aspect, since the fan is rotated at the high speed in case that the vehicle is vibrating, it is possible to preserve the necessary rotation speed of the fan if it can be assumed that it is not necessary to preserve the silence in the cabin as the vehicle is vibrating.

In another aspect of the first information processing apparatus of the present invention, the information processing apparatus further comprises a sound detecting unit, such as a voice microphone or the like, for detecting a sound in a cabin of the vehicle, and the controlling device sets the rotation speed to a high speed, which is higher than a reference rotation speed, if a sound volume of the detected sound is not smaller than a threshold volume, which may be set in advance or may be changed in operation, regardless of a detection result of the detecting device.

According to this aspect, it is possible to preserve the necessary rotation speed of the fan in case that it is not actually silent in the cabin regardless of the operation status of the vehicle.

In another aspect of the first information processing apparatus of the present invention, the information processing apparatus further comprises a sound detecting unit, such as a voice microphone or the like, for detecting a sound in a cabin of the vehicle, and the controlling device sets the rotation speed to a low speed, which is lower than a reference rotation speed, or stops a rotation of the fan if a sound volume of the detected sound is not larger than a threshold volume, which may be set in advance or may be changed in operation, regardless of a detection result of the detecting device.

According to this aspect, it is possible to restrain the generation of the blowing sound of the fan, which disturbs the silence in the cabin, in case that it is actually silent in the cabin regardless of the operation status of the vehicle.

In another aspect of the first information processing apparatus of the present invention, the information processing apparatus further comprises a temperature detecting unit, such as a thermistor or the like, for detecting a temperature within the information processing apparatus, and the controlling device sets the rotation speed to a high speed, which is higher than a reference rotation speed, if the detected temperature is not lower than a threshold temperature, which may be set in advance or may be changed in operation, regardless of a detection result of the detecting device.

According to this aspect, it is possible to cool the information processing apparatus by rotating the fan at the high speed, in case that the temperature in the information processing apparatus is actually high, regardless of the operation status of the vehicle.

In another aspect of the first information processing apparatus of the present invention, the information processing apparatus further comprises a temperature detecting unit, such as a thermistor or the like, for detecting a temperature within the information processing apparatus, and the controlling device sets the rotation speed to a low speed, which is lower than a reference rotation speed, or stops a rotation of the fan if the detected temperature is not higher than a threshold temperature, which may be set in advance or may be changed in operation, regardless of a detection result of the detecting device.

According to this aspect, it is possible to preserve the silence in the cabin, by restraining the unnecessary blowing sound of the fan, in case that the temperature in the information processing apparatus is actually low, regardless of the operation status of the vehicle.

The above object of the present invention can be also achieved by a second information processing apparatus of an on-vehicle type provided with: a fan; a sound volume detecting device, such as a noise microphone or the like, for detecting a sound volume of a sound generated in a cabin of a vehicle; and a controlling device, such as a CPU or the like, for controlling a rotation speed of the fan in accordance with the detected sound volume.

According to the second information processing apparatus of the present invention, since the rotation speed of the fan is controlled in accordance with the sound volume of the sound in the cabin, it is possible to preserve the silence in the cabin of the vehicle as the unnecessary blowing sound of the fan is restrained by decreasing the rotation speed in case that the priority is given to the silence, for example. It is also possible to preserve the necessary rotation speed of the fan to fulfill the cooling function, the dust sucking function or the like, by increasing the rotation speed in case that the priority is not given to the silence (but to the prevention against a failure of the information processing apparatus, for example).

In this manner, it is possible to preserve both of the silence in the cabin and the necessary rotation speed of the fan, depending upon the operation status of the vehicle.

In one aspect of the second information processing apparatus of the present invention, the controlling device sets the rotation speed to a low speed, which is lower than a reference rotation speed, or stops a rotation of the fan if the detected sound volume is not larger than a threshold volume, which may be set in advance or may be changed in operation.

According to this aspect, since the fan is rotated at the low speed or the rotation of the fan is stopped in case that it is silent in the cabin, it is possible to preserve the silence in the cabin by restraining the unnecessary blowing sound of the fan.

In another aspect of the second information processing apparatus of the present invention, the controlling device sets the rotation speed to a high speed, which is higher than a reference rotation speed, if the detected sound volume is larger than a threshold volume, which may be set in advance or may be changed in operation.

According to this aspect, since the fan is rotated at the high speed in case that it is not silent in the cabin, it is possible to preserve the necessary rotation speed of the fan in case that it is not actually silent in the cabin.

In another aspect of the second information processing apparatus of the present invention, the information processing apparatus further comprises a temperature detecting unit, such as a thermistor or the like, for detecting a temperature within the information processing apparatus, and the controlling device sets the rotation speed to a high speed, which is higher than a reference rotation speed, if the detected temperature is not lower than a threshold temperature, which may be set in advance or may be changed in operation, regardless of a detection result of the sound volume detecting device.

According to this aspect, it is possible to cool the information processing apparatus by rotating the fan at the high speed in case that the temperature in the information processing apparatus is actually high, regardless of the sound volume of the sound in the cabin.

In another aspect of the second information processing apparatus of the present invention, the information processing apparatus further comprises a temperature detecting unit, such as a thermistor or the like, for detecting a temperature within the information processing apparatus, and the controlling device sets the rotation speed to a low speed, which is lower than a reference rotation speed, or stops a rotation of the fan if the detected temperature is not higher than a threshold temperature, which may be set in advance or may be changed in operation, regardless of a detection result of the sound volume detecting device.

According to this aspect, it is possible to preserve the silence in the cabin as the unnecessary blowing sound of the fan is restrained by rotating the fan at the low speed in case that the temperature in the information processing apparatus is actually low, regardless of the sound volume of the sound in the cabin.

The above object of the present invention can be also achieved by a third information processing apparatus of an on-vehicle type provided with: a fan; at least two of an operation status detecting device, such as a noise microphone or the like, for detecting an operation status of a vehicle, a sound detecting unit, such as a voice microphone or the like, for detecting a sound in a cabin of the vehicle and a temperature detecting unit, such as a thermistor or the like, for detecting a temperature within the information processing apparatus; and a controlling device, such as a CPU or the like, for setting a rotation speed of the fan to a high speed, which is higher than a reference rotation speed, if a detected value of at least one of the operation status detecting device, the sound detecting unit and the temperature detecting unit is higher than a threshold value, which is set in advance for each of the operation status detecting device, the sound detecting unit and the temperature detecting unit.

According to the third information processing apparatus of the present invention, since the rotation speed of the fan is set to the high speed in case that the detected value of either one of the detecting device is not less than the threshold value thereof, i.e., in case that the generation of the blowing sound of the fan is admitted, it is possible to preserve the necessary rotation speed of the fan, as the occasion demands.

In another aspect of the first information processing apparatus of the present invention, in another aspect of the second information processing apparatus of the present invention or in one aspect of the third information processing apparatus of the present invention, the information processing apparatus reproduces information supplied from a plurality of kinds of sources.

According to this aspect, in case that the information is reproduced in the cabin, it is possible to preserve both of the silence in the cabin and the necessary rotation speed of the fan, by controlling the rotation speed of the fan as the occasion demands.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Figure 1:
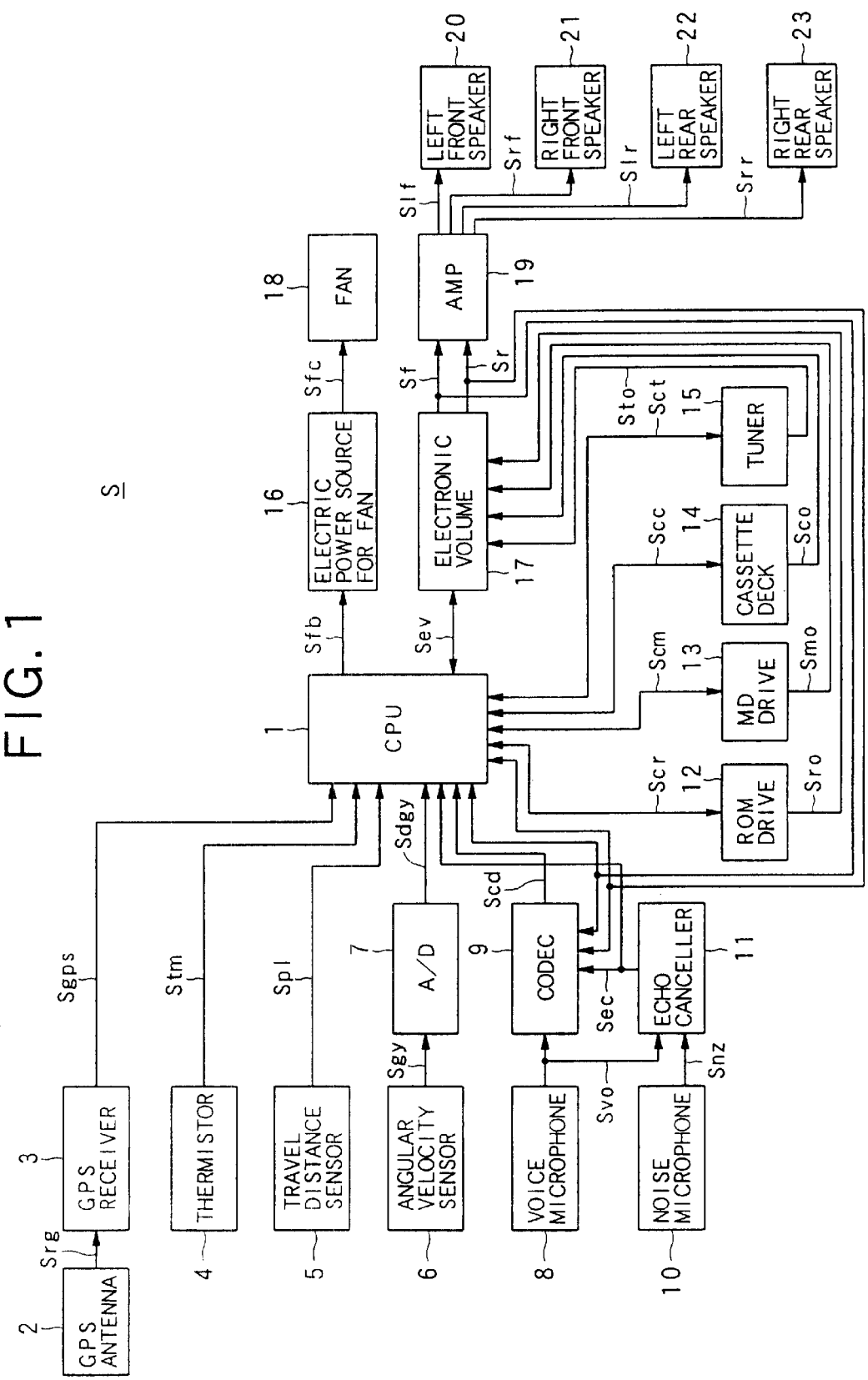
FIG. 1 is a block diagram showing a schematic construction of an information processing apparatus as an embodiment of the present invention.
Figure 2:
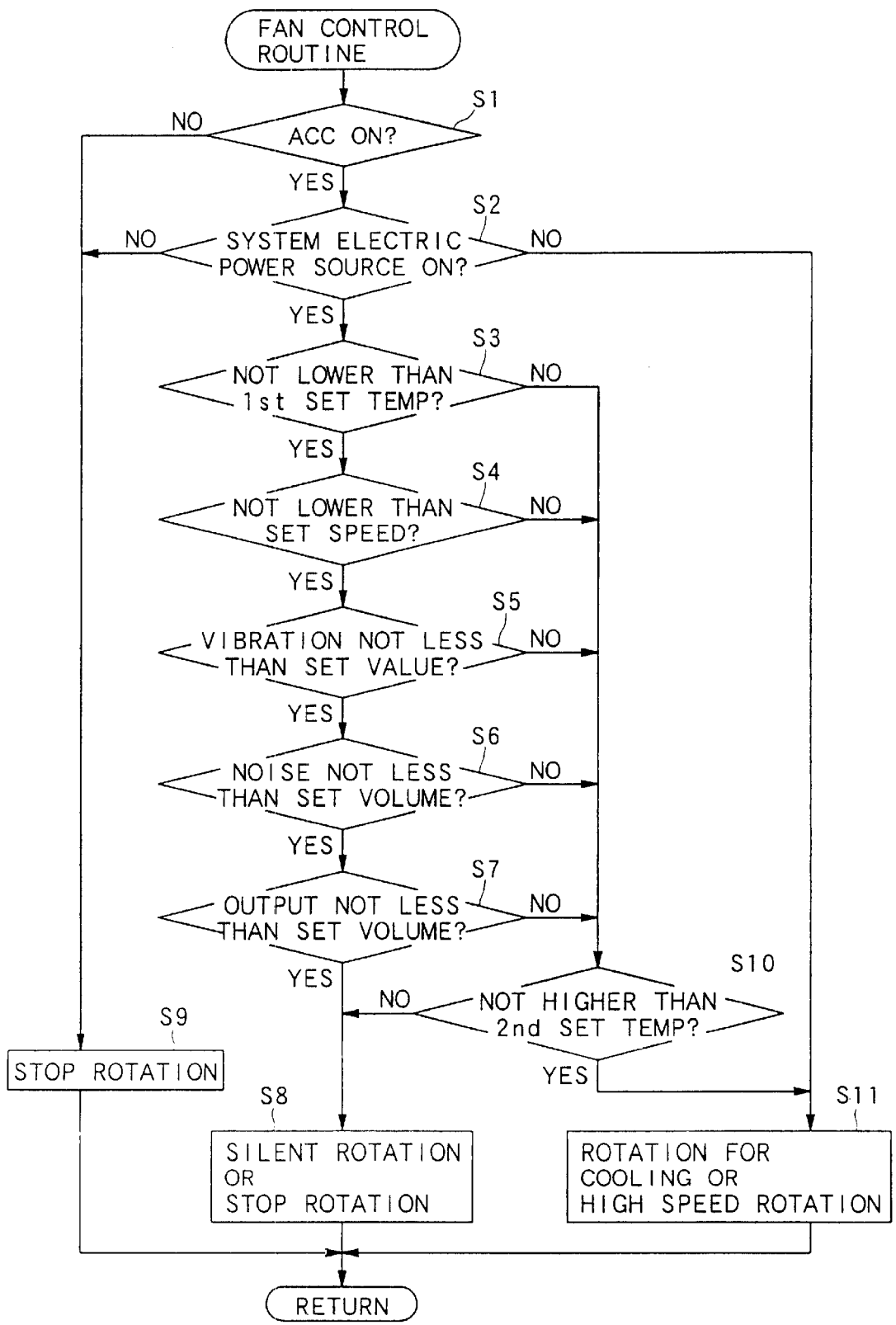
FIG. 2 is a flow chart showing a fan controlling routine of the embodiment.

Embodiments of the present invention will be now explained, with reference to FIG. 1 and FIG. 2. In the following embodiments, the present invention is applied to an information processing apparatus, which is mounted on a vehicle, can reproduce audio information (which is defined as information including music information as well as other sound information, hereinbelow) recorded on a CD, a DVD (which is an optical disc whose record density is improved to be about several times of that of the CD) or the like, and can also perform the navigation process to help the movement of the vehicle while displaying the map or the like.

At first, the structure of the information processing apparatus and a schematic operation of the embodiment is explained with reference to FIG. 1.

As shown in FIG. 1, an information processing apparatus S as the embodiment is provided with: a CPU 1 serving as one example of a controlling device; a GPS (Global Positioning System) antenna 2; a GPS receiver 3; a thermistor 4 serving as one example of a detecting device and a temperature detecting unit; a travel distance sensor 5 as examples of the detecting device and a speed detecting device; an angular velocity sensor 6 having a gyro sensor etc., serving as examples of the detecting device and a vibration detecting device; an AD (Analog to Digital) convertor 7; a voice microphone 8 as examples of the detecting device, a degree of silence detecting device and a sound detecting unit; a codec unit 9; a noise microphone 10 as examples of the detecting device, the sound detecting unit, a sound volume detecting device and an operation status detecting device; an echo canceller 11; a ROM drive 12 including a CD-ROM (CD-Read Only Memory) drive or a DVD-ROM drive; an MD drive 13; a cassette deck 14; a tuner 15 including a radio tuner receiving a radio broadcast electric wave and a television tuner for receiving a television broadcast electric wave; an electric power source 16 for a fan; an electronic volume 17; a fan 18 for cooling an internal space of the information processing apparatus S; an amplifier 19; a left front speaker 20 disposed at a left front side with respect to an advancing direction of the vehicle within the cabin; a right front speaker 21 disposed at a right front side with respect to the advancing direction with in the cabin; a left rear speaker 22 disposed at a left rear side with respect to the advancing direction within the cabin; and a right rear speaker 23 disposed at a right rear side with respect to the advancing direction with in the cabin.

Next, the schematic operation of each constitutional element is explained.

At first, the GPS receiver 2 receives an electric wave from a GPS satellite to thereby generate a reception signal Srg and outputs it to the GPS receiver 3.

By this, the GPS receiver 3 generates the absolute azimuth data of the self vehicle as well as the GPS measurement data on the basis of the reception signal Srg to thereby generate a GPS signal Sgps including those data and outputs it to the CPU 11.

Along with this, the thermistor 4 detects a temperature within the information processing apparatus S (especially at a peripheral portion of the MD drive 13, the CPU 1 and the amplifier 19) to thereby generate a temperature signal Stm and outputs it to the CPU 1.

The travel distance sensor 5 calculates the number of pulses per one rotation of the wheel of the vehicle by counting the number of pulses in a vehicle speed pulse signal outputted in accompaniment with the rotation of the wheel to thereby generate a travel data signal Spl, which includes speed data and travel distance data on the basis of the number of pulses per one rotation, and outputs it to the CPU 1.

Further, the angular velocity sensor 6 detects the angular velocity of the vehicle at the time of changing the direction of the vehicle to thereby generate the angular velocity data and the relative azimuth data. The angular velocity sensor 6 also detects the degree of the vibration of the vehicle to thereby generate the vibration data. Then, the angular velocity sensor 6 generates a gyro signal Sgy including those data and outputs it to the AD converter 7. By this, the AD converter 7 digitizes the gyro signal Sgy to thereby generate a digital gyro signal Sdgy and outputs it to the CPU 1.

On the other hand, the voice microphone 8, which is disposed at a vicinity of the steering wheel for example, is used for inputting a voice inputted from the driver or the like by ON/OFF switching a switch not-illustrated (e.g., a command voice related to the navigation process) to thereby generate a voice signal Svo in response to the inputted voice, and outputs it to the codec unit 9 and the echo canceller 11.

On the other hand, the noise microphone 10 which is kept to be ON is used for detecting a sound generated within the cabin (e.g., (i) a voice detected by the voice microphone 8, (ii) a noise such as a road noise, a blowing sound, a vibration of the vehicle etc., other than the voice, (iii) a sound outputted from the above mentioned respective speakers, and so forth) to hereby generate a noise signal Snz in response to the inputted sound and outputs it to the echo canceller 11.

By this, the echo canceller 11 compares the sound included in the noise signal Snz (i.e., the above mentioned sound generated in the cabin such as the road noise etc., other than the voice, to which the voice and the sounds outputted from the respective speakers are included) with the sound included in the voice signal Svo (most of which is the command voice etc., pronounced by the driver or the like) to thereby generate an echo signal Sec indicative of only the sounds outputted from the respective speakers and the road noise etc., other than the voice, and outputs it to the codec unit 9 and the CPU 1.

Then, the codec unit 9 extracts the voice from the driver or the like, on the basis of the voice signal Svo, the echo signal Sec as well as a front audio signal Sf and a rear audio signal Sr described later. The codec unit 9 also decodes this extracted voice to thereby generate a decode signal Scd, and outputs it to the CPU 1.

Along with those processes, the ROM drive 12 transmits and receives a control signal Scr to and from the CPU 1 to thereby reproduce the audio information and the navigation information recorded on the CD-ROM or the DVD-ROM, which is not illustrated and is set to the ROM drive 12. Then, the ROM drive 12 outputs the audio information among those as an audio signal Sro to the electronic volume 17. At this time, the navigation information is outputted to the CPU 1 and is served for the execution of the navigation process as the information processing apparatus S.

The MO drive 13 transmits and receives a control signal Scm to and from the CPU 1 to thereby reproduce the audio information recorded on the MD, which is not illustrated and is set to the MO drive 13. Then, the MO drive 13 outputs the audio information as an audio signal Smo to the electronic volume 17.

The cassette deck 14 transmits and receives a control signal Scc to and from the CPU 1 to thereby reproduce the audio information recorded on the audio cassette tape, which is not illustrated and is set to the cassette deck 14. Then, the cassette deck 14 outputs the audio information as an audio signal Sco to the electronic volume 17.

The tuner 15 transmits and receives a control signal Sct to and from the CPU 1 to thereby output the audio information included in the received radio broadcast electric wave or the received television broadcast electric wave as an audio signal Sto to the electronic volume 17.

By those processes, the electronic volume 17 transmits and receives a control signal Sev to and from the CPU 1, to thereby control the output level of either one of the audio signals Sro, Smo, Sco and Sto from the respective audio devices. The electronic volume 17 generates the front audio signal Sf, which includes the left front audio information to be outputted from the left front speaker 20 and the right front audio information to be outputted from the right front speaker 21, separately, and outputs this front audio signal Sf to each of the amplifier 19, the codec unit 9 and the CPU 1. Further, the electronic volume 17 generates the rear audio signal Sr, which includes the left rear audio information to be outputted from the left rear speaker 22 and the right rear audio information to be outputted from the right rear speaker 23, separately, and outputs this rear audio signal Sr to each of the amplifier 19, the codec unit 9 and the CPU 1.

Then, the amplifier 19 extracts and separates the left front audio information and the right front audio information from among the front audio signal Sf, to thereby generate a left front audio signal Slf corresponding to the left front audio information and also generate a right front audio signal Srf corresponding to the right front audio information. Further, the amplifier 19 amplifies the left front audio signal Slf and outputs it to the left front speaker 20 to thereby sound-output it into the cabin, and also amplifies the right front audio signal Srf and outputs it to the right front speaker 21 to thereby sound-output it into the cabin.

Along with this, the amplifier 19 extracts and separates the left rear audio information and the right rear audio information from among the rear audio signal Sr, to thereby generate a left rear audio signal Slr corresponding to the left rear audio information and also generate a right rear audio signal Srr corresponding to the right rear audio information. Further, the amplifier 19 amplifies the left rear audio signal Slr and outputs it to the left rear speaker 22 to thereby sound-output it into the cabin, and also amplifies the right rear audio signal Srr and outputs it to the right rear speaker 23 to thereby sound-output it into the cabin.

On the other hand, the electric power source 16 generates an electric power source signal Sfc including the electric power to rotate the fan 18, on the basis of a control signal Sfb from the CPU 1, and outputs it to the fan 18.

Then, the fan 18 generates an air flow within the information processing apparatus S, by rotating at the rotation speed corresponding to the level of the electric power source signal Sfc, so as to cool the respective devices within the information processing apparatus S (especially, the CPU 1, the amplifier 19 and the MD drive 13 which are easily influenced by the heat).

Along with the operations of the respective devices, the CPU 1 generates the respective control signals Scr, Scm, Sct, Sev and Sfb, and outputs them to the respective devices. Also, the CPU 1 performs the navigation process required as the information processing apparatus S on the basis of the GPS signal Sgps, the travel data signal Spl, the decode signal Scd and the digital gyro signal Sdgy.

Furthermore, the CPU 1 controls the rotation speed of the fan 18 as described hereinbelow, on the basis of the temperature signal Stm, the vibration data included in the digital gyro signal Sdgy, the noise level data included in the echo signal Sec, the voice level data included in the decode signal Scd, the speed data included in the travel data signal Spl, the front audio signal Sf and the rear audio signal Sr.

Next, the control of the rotation speed of the fan 18 in the present embodiment is explained with reference to FIG. 2. In FIG. 2, the fan control routine mainly executed by the CPU 1 is illustrated. The fan control routine is an interrupting routine, which is periodically repeated during the execution of the navigation process and the audio information reproducing process (hereinbelow, the navigation process and the audio information reproducing process are collectively referred to as "information process") executed in the information processing apparatus S.

As shown in FIG. 2, in the fan control routine to control the rotation speed of the fan 18, it is firstly judged whether or not the ACC (Accessory) switch (not illustrated) in the vehicle in which the information processing apparatus S is mounted is ON (step S1). If it is not ON (step S1: NO), the operational flow returns to the original information process without rotating the fan 18 (step S9).

On the other hand, if the ACC switch is ON (step S1: YES), it is judged whether or not the system electric power source of the information processing apparatus S itself (i.e., the electric power source used when the information process is actually executed) is ON in the information processing apparatus S (step S2). If it is not ON (step S2: NO), the operational flow returns to the original information process without rotating the fan 18 (step S9).

On the other hand, according to the judgment result at the step S2, if the system electric power source is ON (step S2: YES), it is judged whether or not the temperature within the information processing apparatus S is not lower than a first set temperature, which is set in advance (e.g., 50° C., as a standard temperature indicating that an operation of cooling the information processing apparatus S is emergently required), on the basis of the temperature signal Stm from the thermistor 4 (step S3).

If the internal temperature is not less than the first set temperature (step S3: NO), the fan 18 is rotated at a high rotation speed enough to cool the information processing apparatus S, since it is necessary to cool the internal space of the information processing apparatus S and protect the information processing apparatus S regardless of the degree of silence within the cabin even if the vehicle is not moving (step S11), and the operational flow returns to the original information process.

On the other hand, according to the judgment result at the step S3, if the internal temperature is lower than the first set temperature (step S3: YES), it is judged whether or not the current moving speed of the vehicle is not lower than a set speed which is set in advance (e.g., 30 kilometers/hour) on the basis of the speed data included in the travel data signal Spl (step S4).

Then, if the current moving speed is not lower than the set speed (step S4: NO), it is judged whether or not the internal temperature is not higher than a second set temperature which is set in advance (which is lower than the first set temperature (e.g., 30° C.), and is a threshold temperature indicating a condition where the necessity to cool the information processing apparatus S is rather little and is set as the threshold temperature to reduce the rotation speed of the fan 18), on the basis of the temperature signal Stm, since it is not necessary to preserve the silence in the cabin as for the fan 18 because of the generation of the road noise etc., due to the high speed (step S10).

Then, according to the judgment result at the step S10, if the internal temperature is higher than the second set temperature (step S10: YES), the fan 18 is rotated at the high rotation speed enough to cool the information processing apparatus S, since it is necessary to cool the internal space of the information processing apparatus S and prevent a failure of the information processing apparatus S regardless of the degree of silence within the cabin even if the vehicle is not moving (step S11), and the operational flow returns to the original information process.

On the other hand, according to the judgment result at the step S10, it the internal temperature is not higher than the second set temperature (step S10: NO), the fan 18 is rotated at a low rotation speed enough to preserve the silence within the cabin or the rotation is stopped by a predetermined process, since it is not necessary to cool the information processing apparatus S for the time being (step S8), and the operational flow returns to the original information process.

On the other hand, according to the judgment result at the step S4, if the current moving speed of the vehicle is lower than the set speed (step S4: YES), it is judged whether or not the magnitude of the vibration, which is currently generated within the vehicle, is not less than a set value which is set in advance, on the basis of the vibration data included in the digital gyro signal Sdgy (step S5).

Then, according to the judgment result at the step S5, if the magnitude of the vibration is not less than the set value (step S5: NO), the operational flow proceeds to the step S10 to perform the processes on and after the step S10, since the noise level is rather high because of the driving operation of the engine etc., even if the vehicle is not moving for example, or because the vehicle is traveling on a rough road which causes the vibration such as a graveled road or the like.

On the other hand, according to the judgment result at the step S5, if the magnitude of the vibration is less than the set value (step S5: YES), it is judged the noise within the cabin (in which the noise such as the road noise or the like corresponding to the noise level data and the voice corresponding to the voice level data are included) is not less than a set volume which is set in advance, on the basis of the noise level data included in the echo signal Sec and the voice level data included in the decode signal Scd, since the vehicle is moving at a low speed enough to hardly generate the vibration more than the set value of the vibration or the vehicle is moving silently on a paved road at a low moving speed (step S6).

Then, according to the judgment result at the step S6, if the noise within the cabin is not less than the set volume (step S6: NO), the operational flow proceeds to the step S10 to perform the processes on and after the step S10.

On the other hand, according to the judgment result at the step S6, if the noise within the cabin is less than the set volume (step S6: YES), it is judged whether or not the sound output of respective one of the speakers is not less than the set volume which is set in advance, on the basis of the front audio signal Sf and the rear audio signal Sr (step S7).

According to the judgment result at the step S7, if the sound output is not less than the set volume (step S7: NO), the operational flow proceeds to the step S10 to perform the processes on and after the step S10, since it is not necessary to reduce the rotation speed of the fan 18 in order to obtain the silence even if the noise within the cabin is rather little for example.

On the other hand, according to the judgment result at the step S7, if the sound output is less than the set volume (step S7: YES), the fan 18 is rotated at a low rotation speed enough to preserve the silence within the cabin or the rotation is stopped by a predetermined process, since the noise and the sound output from the respective speakers are so small that the cabin is to be silent for the time being (step S8), and the operational flow returns to the original information process.

As described above, according to the fan control routine in the information processing apparatus S of the present embodiment, since the rotation speed of the fan 18 is controlled depending upon the operation status of the vehicle, it is possible to perform the control such that the silence in the cabin can be preserved as the unnecessary blowing sound of the fan 18 is restrained by decreasing the rotation speed of the fan 18 in case that the priority is given to the silence for example, and that the rotation speed necessary as the fan 18 is maintained by increasing the rotation speed in case that the priority is not given to the silence but to the failure of the devices.

Since the fan 18 is rotated at the low speed or the rotation is stopped if the cabin is actually silent, and since the fan 18 is rotated at the high speed if the vehicle is not silent, it is possible to preserve the silence in the cabin by restraining the blowing sound of the fan 18 and at the same time preserve the rotation speed necessary as the fan 18.

In case that the vehicle is moving at the moving speed not higher than the set speed, since the rotation speed of the fan 18 is set to the low speed or the rotation is stopped, it is possible to more surely preserve the silence in the cabin.

In case that the vehicle is moving at the moving speed not lower than the set speed, since the rotation speed of the fan 18 is set to the high speed, it is possible to preserve the rotation speed necessary as the fan 18 if the vehicle is moving at the moving speed not less than the set speed i.e., if it can be assumed that it is not necessary to preserve the silence in the cabin.

In case that the vehicle is not vibrating (i.e., in case that the vehicle is not moving), the rotation speed of the fan 18 is set to the low speed or the rotation is stopped, so that it is possible to more surely preserve the silence within the cabin.

In case that the vehicle is vibrated, since the rotation speed of the fan 18 is set to the high speed, it is possible to preserve the rotation speed necessary as the fan 18, if the vehicle is vibrated i.e., if it can be assumed that it is not necessary to preserve the silence in the cabin as the vehicle is moving.

In case that the cabin is not silent due to the noise such as the road noise or the like, it is possible to preserve the rotation speed necessary as the fan 18, since the rotation speed of the fan 18 is set to the high speed regardless of the operation status of the vehicle.

In case that the cabin is silent, it is possible to restrain the generation of the blowing sound of the fan 18 which disturbs the silence, since the rotation speed of the fan 18 is set to the low speed or the rotation is stopped regardless of the operation status of the vehicle if the cabin is actually silent.

Further, regardless of the operation status of the vehicle, it is possible to cool the information processing apparatus S by rotating the fan 18 at the high speed if the temperature in the information processing apparatus S is actually high.

Furthermore, regardless of the operation status of the vehicle, it is possible to preserve the silence in the cabin by restraining the unnecessary blowing sound of the fan 18 if the temperature in the information processing apparatus S is actually low.

Incidentally, although the above described embodiment is directed to such a case that the rotation speed of the fan 18 to cool the internal space of the information processing apparatus S is controlled, the present invention may be applied to a rotation speed control of a fan, which is used to suck out dust or dirt accumulated in the internal space of the information processing apparatus S.

Next, various modified embodiments of the above described embodiment are explained hereinbelow. The present invention is not limited to the above described embodiment but can be applied to the various modified embodiments.

Namely, in the above embodiment, the rotation speed of the fan 18 is changed by the three stages (i.e., the rotation stop (corresponding to the step S9 in FIG. 2), the silent rotation (corresponding to the step S8 in FIG. 2) and the rotation for cooling or the high speed rotation (corresponding to the step S11 in FIG. 2). In contrast, in a first modified embodiment, it is possible to change the rotation speed of the fan 18 at four or more stages by preparing a plurality of the set threshold values such as the set temperature or the like. Further, the rotation speed of the fan 18 may be controlled by ultimate stages in correspondence with the respective threshold values (e.g., linearly or in a quadric manner).

In a second modified embodiment, as the method of detecting the volume of the sound in the cabin, the volume value of the electronic volume 17 may be regarded as the level of the sound, as for the volume of the voice of the driver or the like and the volume of the sound outputted from each of the speakers, other than the voice level included in the decode signal Scd from the codec unit 9. Also, the level of the vibration data included in the gyro signal Sdgy or the level of the speed data included in the travel data signal Spl may be regarded as the noise level, as for the noise such as the road noise or the like, other than the noise level data included in the echo signal Sec.

In a third modified embodiment, as the method of detecting the internal temperature of the information processing apparatus S, it is possible to estimate the internal temperature from (i) the operation status of the information professing apparatus S itself, (ii) the ON/OFF of the illumination of the instrument or meter or (iii) the volume value of the electronic volume 17 respectively, other than the method using the temperature signal Stm.

At this time, in case that the internal temperature is estimated from the operation status of the information processing apparatus S itself, the fan 18 may be rotated at the high speed in advance when the MD drive 13 is operated which is easily influenced by the heat. In case that the internal temperature is estimated from the ON/OFF of the illumination of the instrument or meter, the fan 18 may be rotated at the high speed in advance, when the illumination mode is such a mode in which the calorific value is large. In case that the internal temperature is estimated from the volume value of the electronic volume 17, the fan 18 may be rotated at the high speed in advance when the volume value is large since the calorific value of the amplifier 19 is assumed to be approximately proportional to the volume value of the electronic volume 17.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-27316 filed on Jan. 31, 2000 including the specification, claims, drawings and summary is incorporated herein by reference in its entirety.

What is claimed is:

1. An information processing apparatus of an on-vehicle type comprising: a fan; a detecting device for detecting an operation status of a vehicle; and a controlling device for controlling a rotation speed of said fan in accordance with the detected operation status, wherein
   said detecting device comprises a silence degree detecting device for detecting a degree of silence within a cabin of said vehicle, and
   said controlling device sets the rotation speed to a low speed or stops a rotation of said fan if the detected degree of silence is higher than a threshold degree of silence, and sets the rotation speed to a high speed, which is higher than the low speed, if the detected degree of silence is not higher than the threshold degree of silence.

2. An information processing apparatus of an on-vehicle type comprising: a fan; a detecting device for detecting an operation status of a vehicle; and a controlling device for controlling a rotation speed of said fan in accordance with the detected operation status, wherein
   said detecting device comprises a vehicle speed detecting device for detecting a moving speed of said vehicle on the basis of a vehicle speed pulse signal outputted in response to the moving speed, and
   said controlling device sets the rotation speed to a low speed, which is lower than a reference rotation speed, or stops a rotation of said fan if the detected moving speed is not higher than a threshold moving speed.

3. An information processing apparatus of an on-vehicle type comprising: a fan; a detecting device for detecting an operation status of a vehicle; and a controlling device for controlling a rotation speed of said fan in accordance with the detected operation status, wherein
   said detecting device comprises a vehicle speed detecting device for detecting a moving speed of said vehicle on the basis of a vehicle speed pulse signal outputted in response to the moving speed, and
   said controlling device sets the rotation speed to a high speed, which is higher than a reference rotation speed, if the detected moving speed is higher than a threshold moving speed.

4. An information processing apparatus of an on-vehicle type comprising: a fan; a detecting device for detecting an operation status of a vehicle; and a controlling device for controlling a rotation speed of said fan in accordance with the detected operation status, wherein
   said detecting device comprises a vibration detecting device for detecting a vibration of said vehicle, and
   said controlling device sets the rotation speed to a low speed, which is lower than a reference rotation speed, or stops a rotation of said fan if the detected vibration indicates the operation status that said vehicle is not moving.

5. An information processing apparatus of an on-vehicle type comprising: a fan; a detecting device for detecting an operation status of a vehicle; and a controlling device for controlling a rotation speed of said fan in accordance with the detected operation status, wherein
   said detecting device comprises a vibration detecting device for detecting a vibration of said vehicle, and
   said controlling device sets the rotation speed to a high speed, which is higher than a reference rotation speed, if the detected vibration indicates the operation status that said vehicle is vibrating by a certain magnitude.

6. An information processing apparatus of an on-vehicle type comprising: a fan; a detecting device for detecting an operation status of a vehicle; and a controlling device for controlling a rotation speed of said fan in accordance with the detected operation status, wherein
   said information processing apparatus further comprises a sound detecting unit for detecting a sound in a cabin of said vehicle, and
   said controlling device sets the rotation speed to a high speed, which is higher than a reference rotation speed, if a sound volume of the detected sound is not smaller than a threshold volume, regardless of a detection result of said detecting device.

7. An information processing apparatus of an on-vehicle type comprising: a fan; a detecting device for detecting an operation status of a vehicle; and a controlling device for controlling a rotation speed of said fan in accordance with the detected operation status, wherein
   said information processing apparatus further comprises a sound detecting unit for detecting a sound in a cabin of said vehicle, and
   said controlling device sets the rotation speed to a low speed, which is lower than a reference rotation speed, or stops a rotation of said fan if a sound volume of the detected sound is not larger than a threshold volume, regardless of a detection result of said detecting device.

8. An information processing apparatus of an on-vehicle type comprising: a fan; a detecting device for detecting an operation status of a vehicle; and a controlling device for controlling a rotation speed of said fan in accordance with the detected operation status, wherein
   said information processing apparatus further comprises a temperature detecting unit for detecting a temperature within said information processing apparatus, and
   said controlling device sets the rotation speed to a high speed, which is higher than a reference rotation speed, if the detected temperature is not lower than a threshold temperature, regardless of a detection result of said detecting device.

9. An information processing apparatus of an on-vehicle type comprising: a fan; a detecting device for detecting an operation status of a vehicle; and a controlling device for controlling a rotation speed of said fan in accordance with the detected operation status, wherein
   said information processing apparatus further comprises a temperature detecting unit for detecting a temperature within said information processing apparatus, and said controlling device sets the rotation speed to a low speed, which is lower than a reference rotation speed, or stops a rotation of said fan if the detected temperature is not higher than a threshold temperature, regardless of a detection result of said detecting device.

10. An information processing apparatus of an on-vehicle type comprising: a fan; a sound volume detecting device for detecting a sound volume of a sound generated in a cabin of a vehicle; and a controlling device for controlling a rotation speed of said fan in accordance with the detected sound volume, wherein said controlling device sets the rotation speed to a low speed, which is lower than a reference rotation speed, or stops a rotation of said fan if the detected sound volume is not larger than a threshold volume.

11. An information processing apparatus of an on-vehicle type comprising: a fan; a sound volume detecting device for detecting a sound volume of a sound generated in a cabin of a vehicle; and a controlling device for controlling a rotation speed of said fan in accordance with the detected sound volume, wherein said controlling device sets the rotation speed to a high speed, which is higher than a reference rotation speed, if the detected sound volume is larger than a threshold volume.

12. An information processing apparatus of an on-vehicle type comprising: a fan; a sound volume detecting device for detecting a sound volume of a sound generated in a cabin of a vehicle; and a controlling device for controlling a rotation speed of said fan in accordance with the detected sound volume, wherein said information processing apparatus further comprises a temperature detecting unit for detecting a temperature within said information processing apparatus, and said controlling device sets the rotation speed to a high speed, which is higher than a reference rotation speed, if the detected temperature is not lower than a threshold temperature, regardless of a detection result of said sound volume detecting device.

13. An information processing apparatus of an on-vehicle type comprising: a fan; a sound volume detecting device for detecting a sound volume of a sound generated in a cabin of a vehicle; and a controlling device for controlling a rotation speed of said fan in accordance with the detected sound volume, wherein said information processing apparatus further comprises a temperature detecting unit for detecting a temperature within said information processing apparatus, and said controlling device sets the rotation speed to a low speed, which is lower than a reference rotation speed, or stops a rotation of said fan if the detected temperature is not higher than a threshold temperature, regardless of a detection result of said sound volume detecting device.

14. An information processing apparatus of an on-vehicle type comprising:

a fan;

at least two of an operation status detecting device for detecting an operation status of a vehicle, a sound detecting unit for detecting a sound in a cabin of said vehicle and a temperature detecting unit for detecting a temperature within said information processing apparatus; and a controlling device for setting a rotation speed of said fan to a high speed, which is higher than a reference rotation speed, if a detected value of at least one of said operation status detecting device, said sound detecting unit and said temperature detecting unit is higher than a threshold value, which is set in advance for each of said operation status detecting device, said sound detecting unit and said temperature detecting unit.

15. An information processing apparatus of an on-vehicle type comprising: a fan; a detecting device for detecting an operation status of a vehicle; and a controlling device for controlling a rotation speed of said fan in accordance with the detected operation status, wherein said information processing apparatus reproduces information supplied from a plurality of kinds of sources.

16. An information processing apparatus of an on-vehicle type comprising: a fan; a sound volume detecting device for detecting a sound volume of a sound generated in a cabin of a vehicle; and a controlling device for controlling a rotation speed of said fan in accordance with the detected sound volume, wherein said information processing apparatus reproduces information supplied from a plurality of kinds of sources.

17. An information processing apparatus according to claim 14, wherein said information processing apparatus reproduces information supplied from a plurality of kinds of sources.

18. An information processing method for an information processing apparatus of an on-vehicle type with a fan; a detecting device for detecting an operation status of a vehicle; a temperature detecting unit for detecting a temperature within said information processing apparatus, and a controlling device for controlling a rotation speed of said fan in accordance with the detected operation status, and comprising:

a temperature detecting process (S3, S10) for detecting a temperature within said information processing apparatus and judging whether or not said detected temperature is not lower than a threshold temperature; and a rotation speed setting process (S11) for setting said rotation speed to a high speed, which is higher than a reference rotation speed, regardless of a detection result of said detecting device, when said detected temperature is judged not to be lower than said threshold temperature.

* * * * *